United States Patent [19]
Gilbert

[11] Patent Number: 6,002,291
[45] Date of Patent: Dec. 14, 1999

[54] CUBIC TYPE TEMPERATURE FUNCTION GENERATOR WITH ADJUSTABLE PARAMETERS

[75] Inventor: Barrie Gilbert, Portland, Oreg.

[73] Assignee: Analog Devices, Inc., Norwood, Mass.

[21] Appl. No.: 09/032,436

[22] Filed: Feb. 27, 1998

[51] Int. Cl.$^6$ ........................................ H03F 3/45
[52] U.S. Cl. .................... 327/359; 327/129; 327/563
[58] Field of Search .................... 327/129, 359, 327/563, 513; 330/252, 256, 257

[56] References Cited

U.S. PATENT DOCUMENTS

| | | | |
|---|---|---|---|
| 4,460,872 | 7/1984 | Mattisson | 330/252 |
| 4,475,169 | 10/1984 | Gilbert | 364/817 |
| 4,476,538 | 10/1984 | Gilbert | 364/817 |
| 5,648,741 | 7/1997 | Wichern | 327/513 |
| 5,815,039 | 9/1998 | Kimura | 330/252 |

*Primary Examiner*—Tuan T. Lam
*Attorney, Agent, or Firm*—Marger Johnson & McCollom, P.C.

[57] ABSTRACT

A cubic-type function generator combines the outputs from three differential pairs of transistors to generate an output current that varies in a cubic-type manner in response to the input voltage. The input offset voltages of the three differential pairs are set to different values so that the center of the hyperbolic tangent function for each differential pair is shifted along the input axis. By combining the outputs from the three differential pairs out of phase, the separate tanh functions combine to form an output function having an S-shaped curve. The amplitude of the output curve can be adjusted by varying the absolute magnitude of the bias currents to the differential pairs. The tilt and output offset can be adjusted by varying the relative magnitude of the bias currents. By driving the differential pairs with a differential voltage signal that varies as a function of temperature, the present invention generates a cubic-type temperature function. The slope of the differential voltage signal can be adjusted so as to expand or compress the combined output function of the differential pairs along the input axis. The cubic-type function generator is particularly useful for providing temperature compensation for crystal oscillators because the parameters of the output function can be adjusted to precisely match the parameters of the crystal.

37 Claims, 6 Drawing Sheets

CUBIC TYPE TEMPERATURE FUNCTION GENERATOR WITH ADJUSTABLE PARAMETERS

BACKGROUND OF THE INVENTION

This invention relates generally to function generators, and more particularly to a circuit for generating a cubic-type function having adjustable parameters.

SUMMARY OF THE INVENTION

A cubic-type function generator constructed according to the present invention combines the outputs from three differential pairs of BJT transistors to generate an output signal that varies in a cubic-type manner in response to an input signal. The input offset voltages of the three differential pairs are set to different values so that the center of the hyperbolic tangent ("tanh") function of each pair is shifted along the input axis. (A tanh output function is an inherent characteristic of a BJT differential pair.) By combining the outputs from the three differential pairs out of phase, the separate tanh functions combine to form an output function having cubic-type characteristic. As used herein, "cubic-type" refers to a characteristic that is either a true cubic function, or that has an S-shape similar to that of a true cubic function.

In one embodiment of the present invention, the three differential pairs of transistors are coupled to a voltage generator which generates a differential voltage signal that varies as a function of temperature. By using the differential voltage signal as the input signal to the three differential pairs, the present invention generates a cubic-type temperature function.

The slope of the differential voltage signal can be adjusted so as to expand or compress the combined output function of the differential pairs along the input axis. The bias currents for the three differential pairs can also be adjusted so as to adjust the magnitude of the cubic-type curve, as well as the shape, or "tilt", of the curve.

A cubic-type function generator constructed according to the present invention is particularly useful for providing temperature compensation for crystal oscillators because the resonant frequency of a quartz crystal shows a cubic-type variation with temperature. Since the present invention provides complete control of the parameters of the temperature function, the temperature function can be precisely matched to the parameters of the crystal, which vary with the angle of cut.

Therefore, it is an object of the present invention to provide a method and apparatus for generating a cubic-type function.

Another object of the present invention is to generate a cubic-type signal as a function of temperature.

A further object of the present invention is provide a technique for compensating a crystal oscillator for variations in temperature.

To accomplish these and other objects, a function generator constructed in accordance with the present invention includes: a first differential pair of transistors arranged to generate a first current responsive to an input signal; a second differential pair of transistors arranged to generate a second current responsive to the input signal; a third differential pair of transistors arranged to generate a third current responsive to the input signal; and a bias circuit coupled to the first, second, and third differential pairs for providing first, second, and third bias currents to the first, second, and third differential pairs, respectively; wherein the first, second, and third differential pairs of transistors have different input offset voltages; and wherein the first, second, and third differential pairs are coupled together such that the first, second and third currents combine out of phase, thereby producing an output current that varies in a cubic-type manner responsive to variations in the input signal.

The bias circuit can adjust the absolute magnitude of the bias currents, thereby changing the amplitude of the combined output function of the differential pairs. The bias circuit can also adjust the relative magnitude of the bias currents, thereby changing the shape of the combined output function of the differential pairs.

The function generator can further include a voltage generator coupled to the first, second, and third differential pairs for generating the input signal responsive to temperature.

In one embodiment, the input signal has a slope; and the voltage generator adjusts the slope of the input signal, thereby expanding or compressing the combined output function of the differential pairs along the input axis.

The bias currents can be unbalanced under normal conditions so as to adjust the center voltage of the output voltage generated by the current-to-voltage converter.

In another embodiment, the function generator further includes a compensation circuit coupled to the first, second, and third differential pairs for adjusting the input signal, thereby compensating for temperature variations in the first, second, and third differential pairs.

Another aspect of the present invention is a method for generating a cubic-type function comprising: driving a first differential pair of transistors having a first input offset voltage responsive to an input signal, thereby generating a first tanh signal; driving a second differential pair of transistors having a second input offset voltage responsive to the input signal, thereby generating a second tanh signal; driving a third differential pair of transistors having a third input offset voltage responsive to the input signal, thereby generating a third tanh signal; and combining the first, second and third tanh signals out of phase, thereby generating an output signal having a cubic-type output function.

An advantage of the present invention is that it provides a simple and elegant technique for generating a cubic-type function.

Another advantage of the present invention is that it utilizes components which perform multiple functions, thereby reducing the number of components required to achieve a high level of functionality.

The foregoing and other objects, features and advantages of the invention will become more readily apparent from the following detailed description of a preferred embodiment of the invention which proceeds with reference to the accompanying drawings.

DETAILED DESCRIPTION

Figure 1:
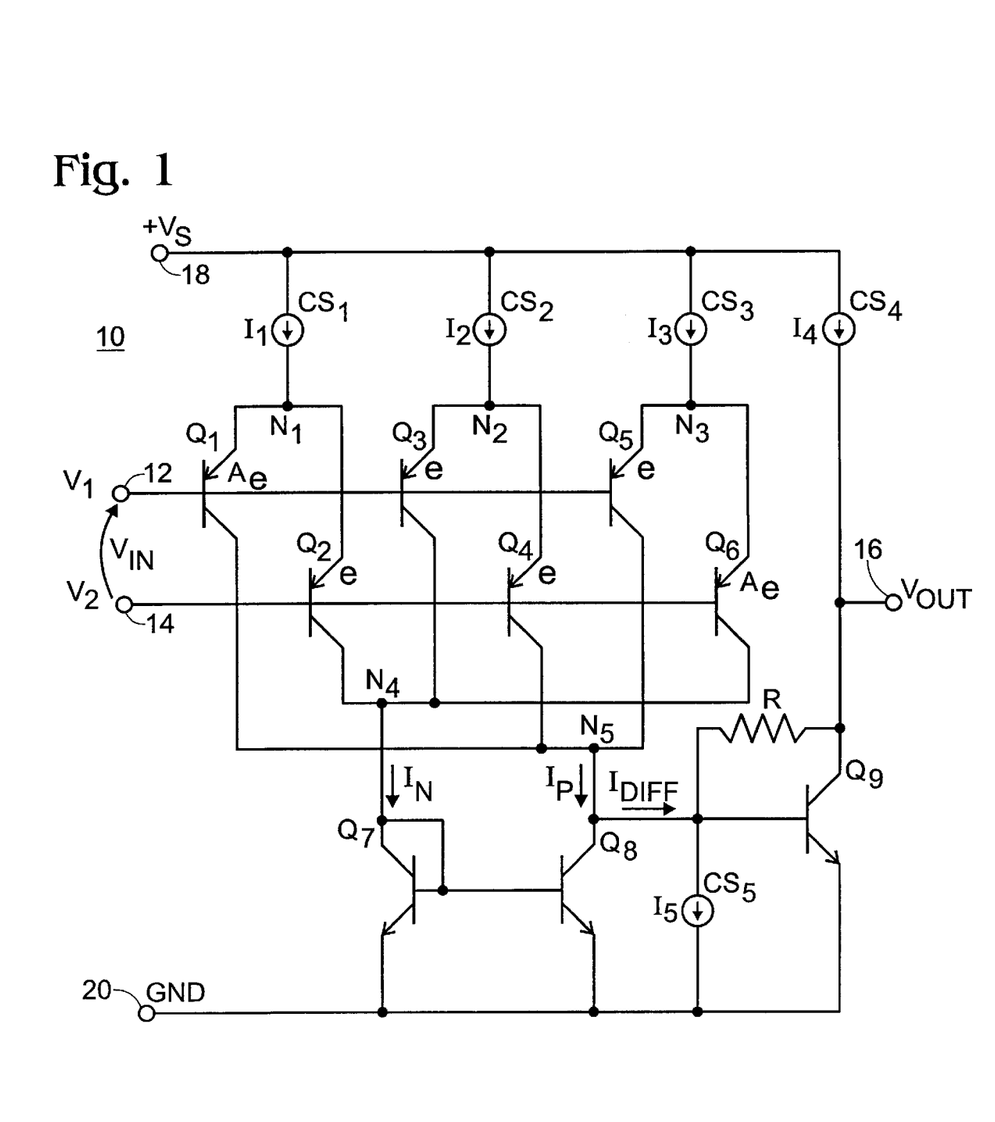
FIG. 1 is a schematic diagram of an embodiment of a cubic-type function generator in accordance with the present invention.

Referring to FIG. 1, an embodiment of a cubic-type function generator in accordance with the present invention is shown generally at 10. The function generator 10 includes a cross-connected triplet core formed from three differential pairs of NPN bipolar junction transistors Q1–Q2, Q3–Q4, and Q5–Q6. The function generator also includes current sources CS1–CS3 for biasing the three differential pairs of transistors, a current mirror formed from transistors Q7 and Q8, and a current-to-voltage converter formed from current source CS4, NPN transistor Q9, and resistor R. The emitters of differential pairs Q1–Q2, Q3–Q4 and Q5–Q6 are connected to nodes N1, N2 and N3, respectively. The bases of Q1, Q3 and Q5 are commonly connected to a terminal 12 for receiving an input voltage V1, while the bases of Q2, Q4, and Q6 are commonly connected to a second input terminal 14 for receiving a second input voltage V2. Input voltages VI and V2 form a differential input voltage $V_{IN}$ which is equal to the difference therebetween. The collectors of the differential pairs are cross-connected such that the collectors of Q1, Q4, and Q5 are commonly connected to a node N5 and the collectors of Q2, Q3 and Q6 commonly connected to a node N4 so that the output currents from the differential pairs combine out of phase. Current source CS1 is connected between node N1 and power supply terminal 18 which receives a positive power supply voltage $+V_S$. Likewise, current source CS2 is connected between node N2 and $+V_S$, and current source CS3 is connected between node N3 and $+V_S$.

Current mirror transistor Q7 has a collector connected to node N4, an emitter connected to a second power supply terminal 20 which receives a power supply ground signal GND, and a base that is diode connected back to its collector. Current mirror transistor Q8 includes a collector connected to node N4, an emitter connected to GND, and a base that is connected to the base of transistor Q7.

Transistor Q9 in the current-to-voltage converter has an emitter connected to GND, a base connected to node N5, and a collector connected to an output terminal 16 for providing an output voltage signal $V_{OUT}$. Resistor R is connected between the base and collector of Q19 and a current source CS4 is connected between the collector of Q9 and $+V_S$. A current source CS5 is coupled between the base of transistor Q9 and GND.

Differential pairs Q1–Q2, Q3–Q4, and Q5–Q6 are constructed or otherwise arranged to have different input offset voltages. In the embodiment of FIG. 1, the input offset voltages are implemented by providing the differential pairs with different emitter area ratios. Differential pair Q3–Q4 is shown with transistors that have equal emitter areas "e", where "e" is a unit emitter area, and thus, has an input offset voltage equal to zero. Transistor Q2 is shown with an emitter area of "e", while transistor Q1 has an emitter area "Ae", thus providing an emitter area ratio of A:1. This provides differential pair Q1–Q2 with an input offset voltage of $V_T$ In A where $V_T$ is the thermal voltage which is approximately 26 mV at 300 K. Similarly, the emitters of differential pair Q5–Q6 are ratioed to provide a ratio of 1:A, and thus an input offset voltage of $V_T$ In A in the opposite direction.

In operation, current sources CS1–CS3 set the tail currents 11, 12 and 13 through differential pairs Q1–Q2, Q3–Q4, and Q5–Q6, respectively. Each of the differential pairs generates a hyperbolic tangent ("tanh") output current at its collectors in response to the differential input voltage $V_{IN}$. The differential currents from the three differential pairs are summed at nodes N4 and N5 to produce a combined output current which is the difference between currents IC1 and IC2 flowing into the collectors of Q7 and Q8, respectively. Because each of the differential pairs has a different input offset voltage, the tanh function from each differential pair is displaced along the input voltage axis to produce an output current having a cubic-type response to the input voltage as described in more detail below.

The current mirror formed by transistors Q7 and Q8 force a difference current $I_{DIFF}$, which is equal to the difference between the current IC1 and IC2 to flow through resistor R. (The base current of Q9 is negligible.) The difference current $I_{DIFF}$ through resistor R is converted by transistor Q9, which is biased by current 14 generated by current source CS4, to an output voltage signal $V_{OUT}$ at output terminal 16.

Figure 2:
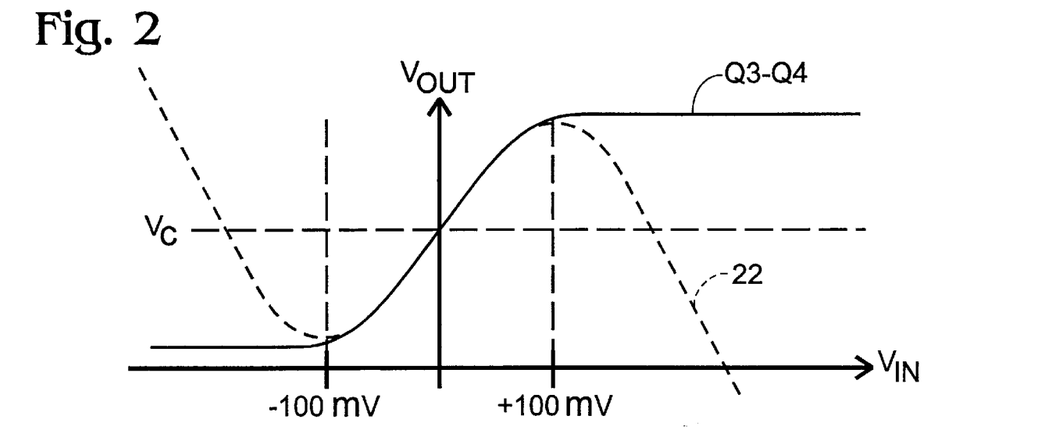
FIGS. 2 through 4 are graphs illustrating the operation of the circuit of FIG. 1.

The operation of the function generator 10 of FIG. 1 will now be described in more detail with reference to FIGS. 2 and 3. If the outer differential pairs Q1–Q2 and Q5–Q6 were eliminated, the output voltage from the inner differential pair Q3–Q4 would be a tanh function of the input voltage $V_{IN}$ as shown in FIG. 2. By adjusting the level of the current 15 through current source CS5, the center point $V_C$ of the tanh function can be adjusted up and down on the output voltage axis. The curvature of the tanh function from Q3–Q4 begins to level off at about ±100 mV of input voltage. Thus, the center differential pair Q3–Q4 provides the central portion of the desired cubic-type function which is shown by dashed line 22.

Figure 3:
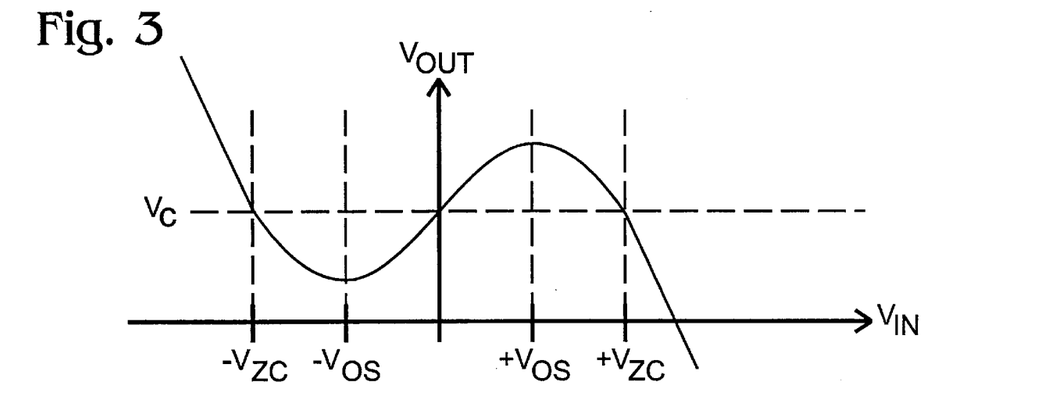

By adding the outer differential pairs Q1–Q2 and Q5–Q6 as shown in FIG. 1, two additional tanh curves, one of which is shifted by an amount +VT In A along the input axis, and the other of which is shifted an amount –VT In A along the input axis, are combined with the curve Q3–Q4 as shown in FIG. 2 to generate the cubic-type curve shown in FIG. 3. The center portion of the curve in FIG. 3 is essentially the same as the center portion in FIG. 2. However, as the curve reaches the points $+V_T$ In A and $-V_T$ In A, it begins to turn around again due to the influence of the outer differential pairs. Thus, in the region between zero and $+V_{ZC}$ in the curve of FIG. 3, the cubic-type function is approximated by a portion of a sinusoid which is obtained by adding the offset tanh functions.

Figure 4:
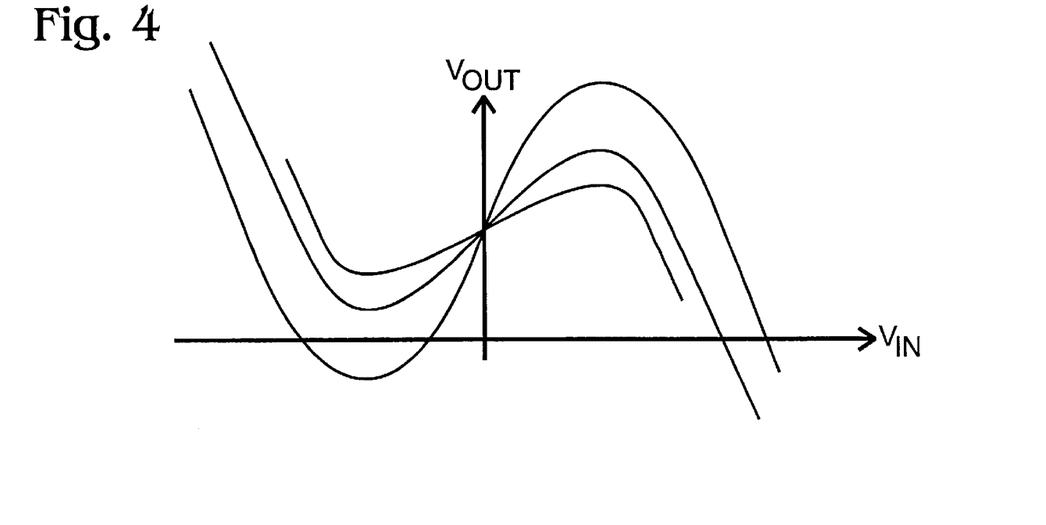

By varying the value of the tail currents I1, 12 and I3, which are typically equal, the magnitude of the cubic-type output function can be varied. FIG. 4 is a graph showing the output voltage $V_{OUT}$ as a function of the input voltage $V_{IN}$ for the circuit of FIG. 1 at various values of tail current.

By implementing the current source CS5 as a proportional to absolute temperature (PTAT) current source, the center voltage $V_C$ is lifted to a voltage that is equal to the $V_{BE}$ of Q9, which is complementary to absolute temperature (CTAT), plus a PTAT voltage, which, when combined with the CTAT voltage, produces a temperature stable voltage. Thus, the center voltage $V_C$ remains stable with fluctuations in temperature. Alternatively, the magnitude and temperature shaping of current 15 from current source CS5 can be varied (e.g., made non-PTAT) to set the center voltage $V_C$ at one-half of the supply voltage $+V_S$.

Another technique for setting the center voltage $V_C$ is to eliminate current source CS5 and skew the tail currents I1, I2 and I3 into the differential pairs in the triplet so that the output currents from the differential pairs are not quite balanced under normal conditions. This results in a non-zero value of the differential current $I_{DIFF}$ flowing through resistor R which sets the center point VC of the output function. An advantage of this technique is that it reduces the number of components required to implement the function generator by utilizing the current sources CS1, CS2 and CS3 to perform multiple functions.

Figure 6:
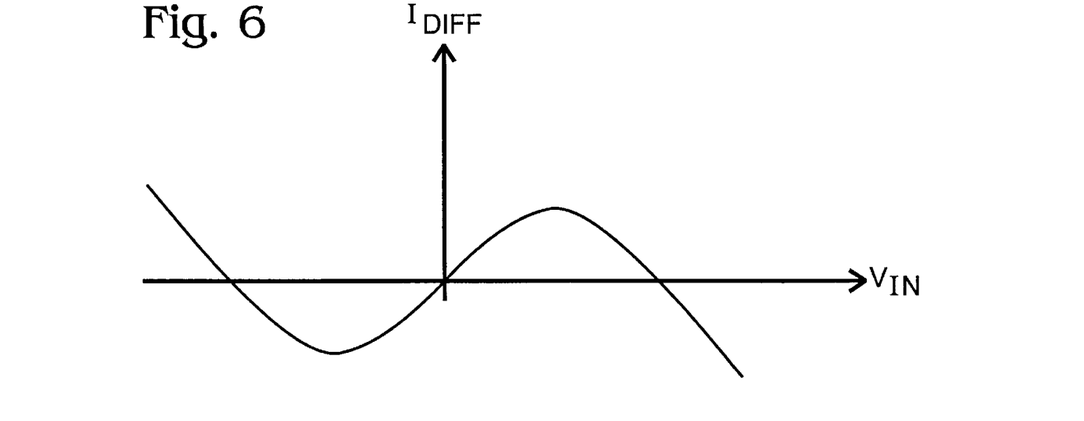
FIGS. 6 through 8 are graphs illustrating the operation of the circuit of FIG. I with changes in temperature.
Figure 7:
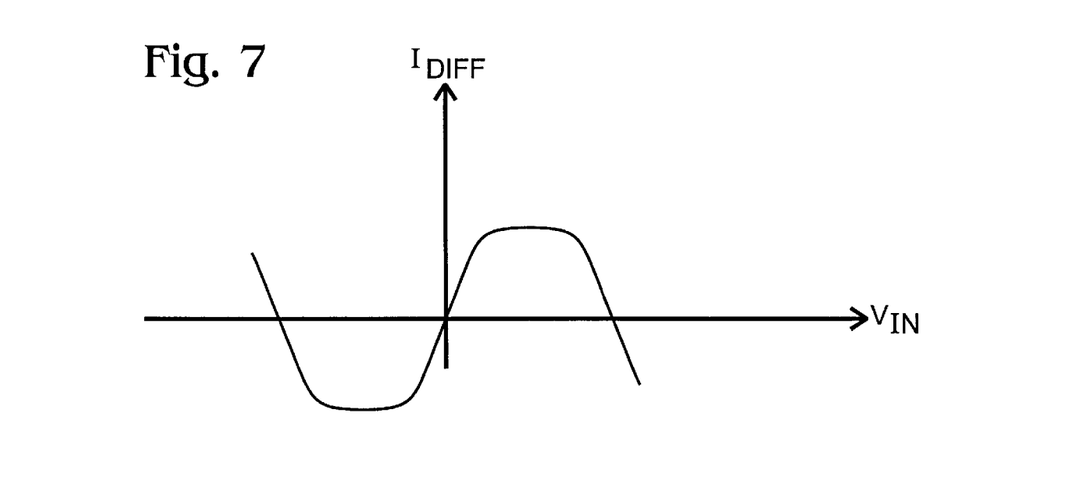
Figure 8:
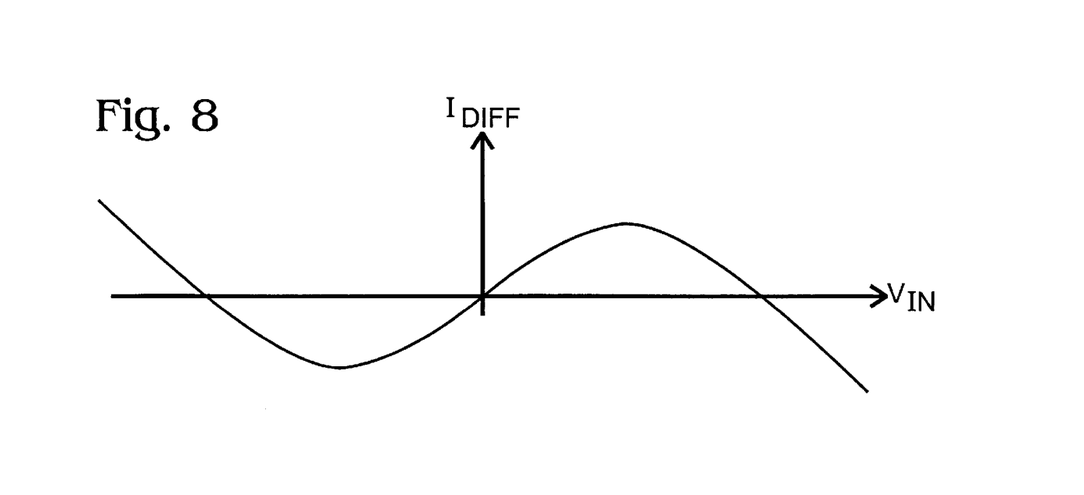

The graphs shown in FIGS. 2, 3, and 4 illustrate the output characteristics of the function generator 10 of FIG. 1 while the function generator is held at a constant temperature. However, the shape of the curve in FIG. 3 changes as the temperature of the triplet changes. This can be illustrated with reference to FIGS. 6, 7, and 8 which show graphs of the differential output current from the triplet $I_{DIFF}$ as a function of the input voltage $V_{IN}$ for various temperatures. For example, if FIG. 6 shows the cubic-type curve of the output current as a function of input voltage at 300° K., then FIG. 7 shows the differential output current as a function of input voltage for the same circuit at a reduced temperature. As seen from FIG. 7, the waveform becomes squared off as the temperature decreases. In the extreme case of 0° K., the output characteristic would be completely squared off. In contrast, FIG. 8 shows the curve for a triplet that is at a temperature much greater than 300° K. As seen from FIG. 8, the curve "softens" as temperature of the triplet increases.

The three differential pairs can be compensated for temperature variations by converting the input voltage $V_{IN}$ to a PTAT voltage. That is, if $V_{IN}$ varies in proportion to absolute temperature, the shape of the output curve in FIG. 6 remains constant with variations in temperature.

Figure 9:
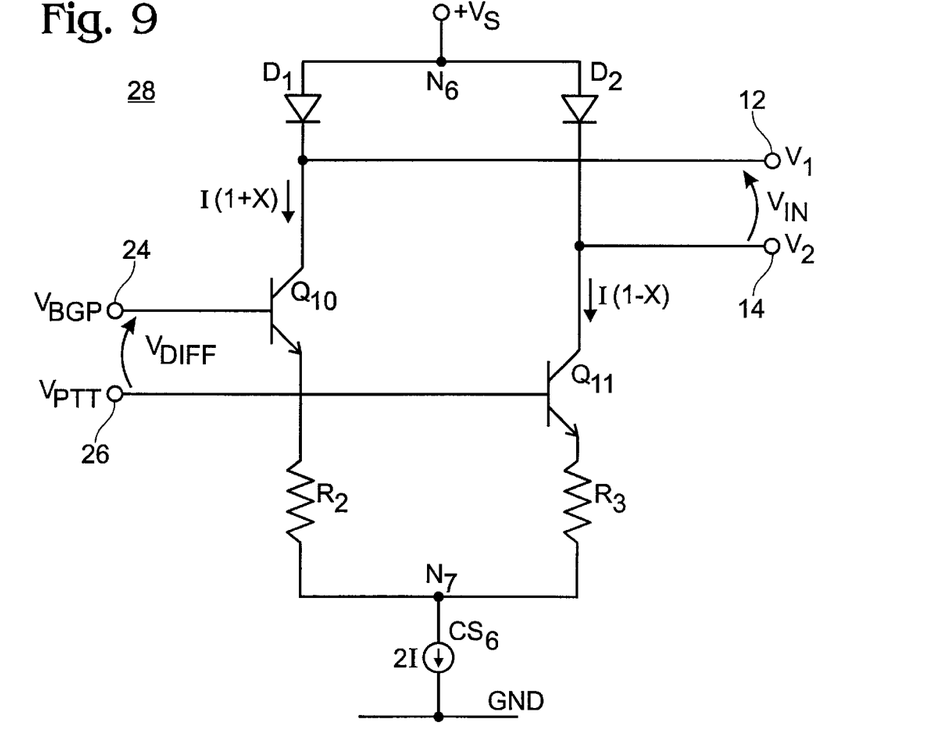
FIG. 9 is a schematic diagram of a compensation circuit in accordance with the present invention.

FIG. 9 is a schematic diagram of an embodiment of a compensation circuit for compensating the input voltage VIN for variations in temperature in accordance with present invention. The compensation circuit, shown generally at 28, is configured as a translinear multiplier and includes diodes D1 and D2, NPN transistors Q10 and Q11, resistors R2 and R3 and current source CS6. The anodes of diodes D1 and D2 are both connected to the positive power supply $+V_S$ at node N6. The cathode of D1 is connected to the first input terminal 12 of FIG. 1, while the cathode of D2 is connected to the second input terminal 14 of FIG. 1.

Referring again to FIG. 9, transistor Q10 has a collector connected to the cathode of D1, an emitter coupled to node N7 through resistor R2, and a base connected to an input terminal 24 for receiving the voltage signal VBGP. Transistor Q1 has a collector connected to the cathode of D2, an emitter coupled to node N7 through a resistor R3, and a base connected to an input terminal 26 for receiving the voltage signal $V_{PTT}$. The differential input voltage $V_{DIFF}$ is defined as the difference between $V_{BGP}$ and $V_{PTT}$. Current source CS6 is connected between node N7 and GND and biases transistors Q10 and Q11 with a bias current 21. If the current into the collector of Q10 is defined as I(1+X) and the current into the collector of Q11 is defined as I(1−X), then V1=kT/q ln [(1+X)/(1−X)]. Therefore, if the temperature of compensation circuit 28 is maintained at the same temperature as the three differential pairs Q1–Q2, Q3–Q4 and Q5–Q6, then for any given input voltage $V_{DIFF}$, the voltage $V_{IN}$ varies in proportion to absolute temperature, and thus, the shape of the curve in FIG. 3 remains constant with variations in temperature where $V_{IN}$ in FIG. 3 is now replaced with $V_{DIFF}$.

A cubic-type function generator constructed in accordance with the present invention is particularly useful for compensating crystal oscillators for temperature variations. Oscillators based on quartz crystals are widely used to provide stable timing signals for electronic circuits. A problem with quartz crystals, however, is that the resonant frequency of a crystal varies with temperature. This causes undesirable temperature dependent frequency variations in electronic equipment such as portable communications devices which must operate at a precise frequency over wide temperature ranges.

Figure 10:
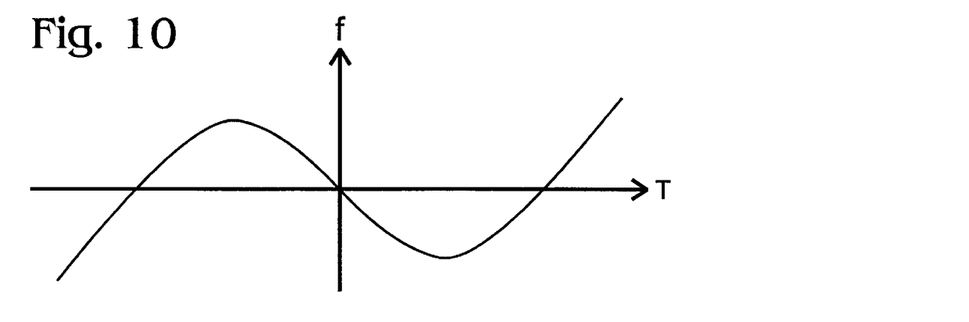
FIG. 10 is a graph illustrating the temperature characteristics of a quartz crystal.

FIG. 10 is a graph showing the oscillation frequency of a typical quartz crystal as a function of temperature. The parameters of the curve shown in FIG. 10 vary with the angle at which the crystal is cut. Since the shape of the curve of FIG. 10 is generally S-shaped in the inverse from that shown in FIG. 3, the cubic-type function generator 10 of FIG. 1 can be used to compensate a crystal oscillator for variations in temperature by driving it with an input signal that varies with the temperature of the oscillator circuit.

Figure 11:
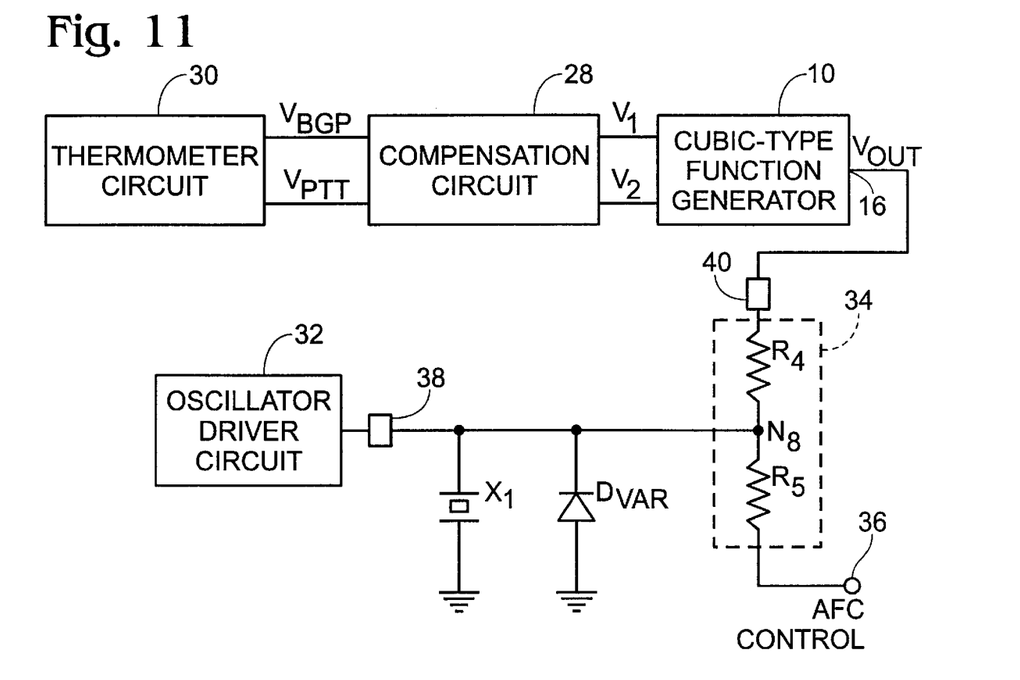
FIG. 11 is a hybrid schematic and block diagram showing a complete temperature compensated crystal oscillator system in accordance with the present invention.

FIG. 11 is a combined schematic and block diagram illustrating a circuit for compensating a crystal oscillator for variations in temperature in accordance with the present invention. The circuit of FIG. 11 includes a cubic-type function generator such as circuit 10 shown in FIG. 1, a compensation circuit such as 28 from FIG. 9, and a thermometer circuit 30. The thermometer circuit 30 generates a first voltage signal $V_{BGP}$, which is a temperature stable bandgap reference voltage, and a temperature-varying voltage $V_{PTT}$ which is a PTAT voltage that is modified to have a non-zero intercept and a steep slope that is not as steep as a true PTAT voltage. The output terminal 16 of the function generator 10 is connected to an external resistance matrix 34 which includes series connected resistors R4 and R5. The resistance matrix adjusts the bias DC current level through a varactor diode $D_{VAR}$ which is connected in series with a quartz crystal X1 for adjusting the frequency thereof. The crystal is driven by an oscillator drive circuit 32 such as that shown in copending U.S. patent application Ser. No. 09/032, 228, filed Feb. 27, 1998, entitled "Crystal Oscillator Driver With Amplitude Control", which is incorporated herein by reference.

In a preferred embodiment, the thermometer circuit, compensation circuit, function generator, and drive circuit are fabricated on a single integrated circuit, and interfaced to external components through bond pads 38 and 40. Bond pad 40 is connected to output terminal 16 of the function generator 10, while bond pad 38 is connected to the output terminal of oscillator drive circuit 32. Resistor R4 is connected between bond pad 40 and a node N8, while resistor R5 is connected between node N8 and a control terminal 36 for receiving an automatic frequency control ("AFC") signal. Varactor Diode $D_{VAR}$ is connected in parallel with crystal X1 between node N8 and ground. Bond pad 38 is connected to node N8.

In operation, the thermometer circuit, compensation circuit and function generator, generate an output voltage $V_{OUT}$ having a cubic-type characteristic as a function of temperature which adjusts the varactor diode $D_{VAR}$ through the external resistor matrix 34 to maintain the frequency of the oscillation of the quartz crystal X1 at a stable level. In a preferred embodiment, the crystal X1, varactor diode, and resistor matrix are external components.

Figure 12:
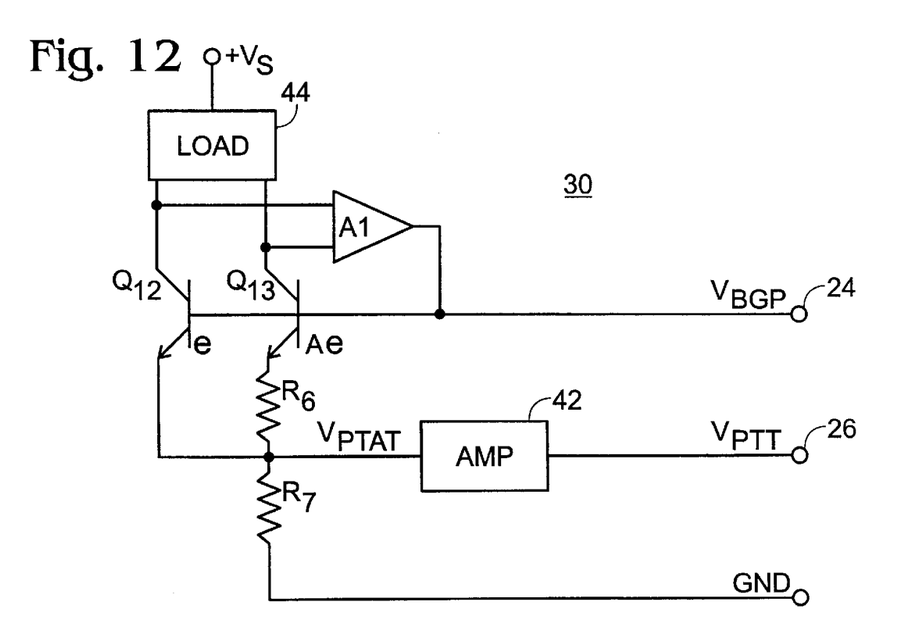
FIG. 12 is a hybrid schematic and block diagram of a thermometer circuit in accordance with the present invention.

FIG. 12 is a simplified schematic diagram showing an exemplary embodiment of a thermometer circuit 30 of FIG. 11. Referring to FIG. 12, a loading circuit 44, transistors Q12 and Q13, resistors R6 and R7, and amplifier A1 are configured to form a bandgap voltage reference which is generally known in the art and described in more detail in co-pending U.S. patent application Ser. No. 08/918,728 filed Aug. 21, 1997 entitled "RF Mixer With Inductive Degeneration", which is herein incorporated by reference. The bandgap generator generates a PTAT voltage $V_{PTAT}$ at node N9, which, when combined with the CTAT voltage across the base to emitter junction of Q12, generates a stable bandgap voltage $V_{BGP}$ at output terminal 24. The PTAT voltage at node N9 is manipulated by amplifier 42 so as to give it an offset and change the slope, thereby generating the voltage $V_{PTT}$ at output terminal 26. Amplifier 42 is preferably implemented as an op amp configured in a classic non-inverting configuration in which the signal $V_{PTAT}$ is coupled to the non-inverting input, the output is coupled to the inverting input through a first resistor, a second resistor is coupled between the inverting input and GND, and the output is taken from the output of the op amp.

Figure 13:
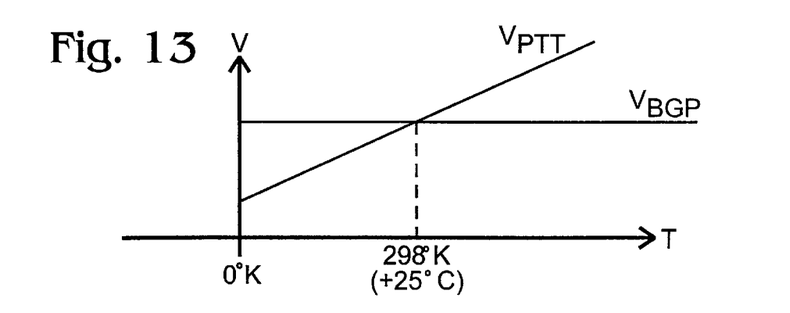
FIG. 13 is a graph illustrating the operation of the circuit of FIG. 12.

FIG. 13 is a graph showing the voltages of signals $V_{BGP}$ and $V_{PTT}$, as a function of temperature. Note that the signals $V_{BGP}$ and $V_{PTT}$, cross over at 25° C. and $V_{PTT}$, has a non-zero value at 0° K.

An advantage of generating the signals $V_{PTT}$ and $V_{BGP}$ based on the same bandgap reference cell is that they maintain a very accurate differential voltage as the temperature of the thermometer circuit varies over its operating range.

Figure 14:
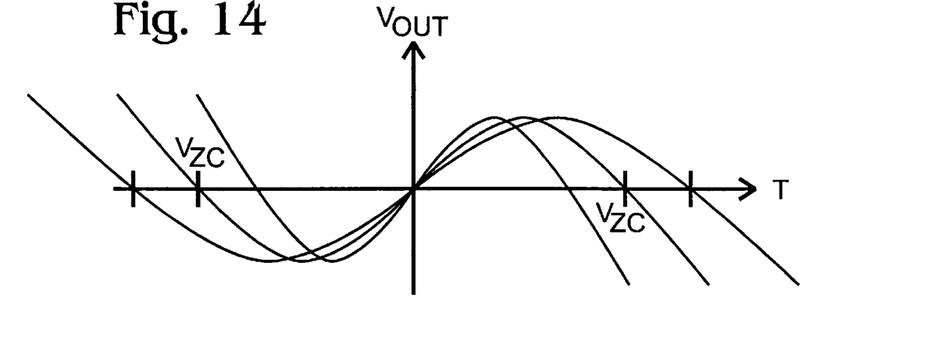
FIG. 14 is a graph illustrating the combined operation of the circuits of FIGS. 1, 9, and 12.

By driving the compensation circuit 28 and function generator 10 of FIG. 11 with the signals $V_{PTT}$ and $V_{BGP}$ of FIG. 13, an output voltage $V_{OUT}$ having a cubic-type characteristic can be generated similar to that shown in FIG. 3 only with temperature as the independent axis instead of input voltage. By adjusting the slope and intercept of the signal $V_{PTT}$ of FIG. 13, the output function of the output voltage $V_{OUT}$ can be expanded or compressed along the temperature axis as shown in FIG. 14 which is a graph of the output function $V_{OUT}$ as a function of temperature for several different values of slope for $V_{PTT}$. FIG. 14 shows how the zero crosses, indicated as $V_{ZC}$ vary with the slope of $V_{PTT}$.

Since the zero crosses of the output function of $V_{OUT}$ can be adjusted by adjusting the slope and cross-over point of $V_{PTT}$, the function generator 10 can be adjusted to fit the curve of any desired crystal. For example, assuming a crystal has an inner zero cross at 25° C. and outer zero crosses at −10° and +60° C., the slope of $V_{PTT}$ can be adjusted to place the zero crosses of $V_{OUT}$ so that they coincide exactly with the zero crosses of the particular crystal sought to be compensated.

Figure 15:
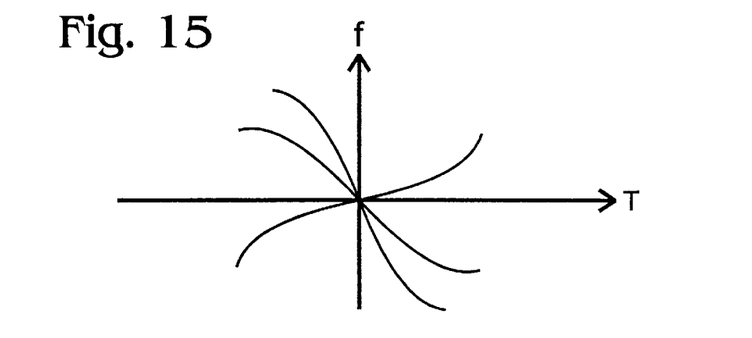
FIG. 15 is a graph illustrating variations in the temperature characteristics of a quartz crystal for different angles of cut.

The frequency versus temperature function of a crystal exhibits a characteristic known as "tilt". This is the angle at which the function passes through the inner zero cross. FIG. 15 is a graph showing the frequency versus temperature characteristic of several different crystals having different values of tilt.

Figure 16:
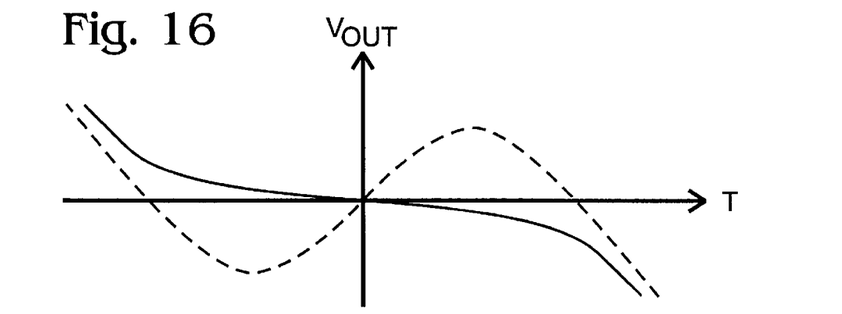
FIGS. 16 and 17 are graphs illustrating the effect of the tilt circuit of FIG. 5.
Figure 17:
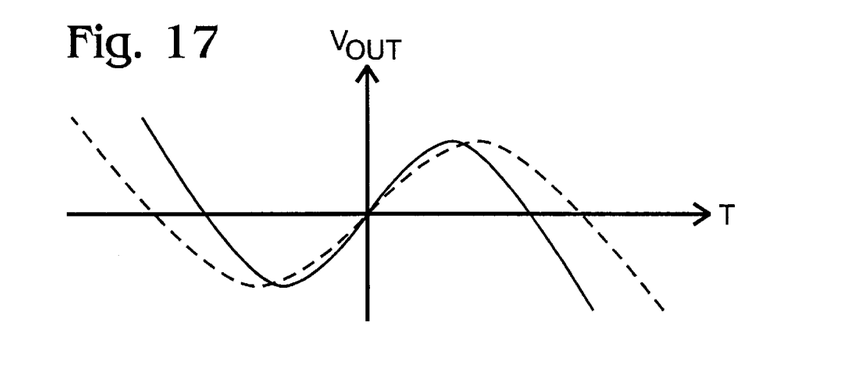

By changing the relative magnitude of the center bias current I2 of FIG. 1 with respect to the outer bias currents 11 and 13, the output function of $V_{OUT}$ can be adjusted to compensate for the tilt of the crystal. FIG. 16 is a graph showing the output function of $V_{OUT}$ as a function of temperature of the circuit of FIG. 1 where the center bias current 12 is less than the outer currents 11 and 13. The output function for the same circuit when the bias currents are equal is shown with a broken line for comparison. Likewise, the output function for the circuit of FIG. 1 when the inner bias current 12 is greater than the outer bias currents 11 and 13 is shown in FIG. 17. Thus, by adjusting the relative magnitudes of the inner and outer bias currents, the shape of the temperature function can be manipulated to fit the tilt of a crystal. This is very advantageous because a manufacturer wishing to use a batch of crystals which, due to their cut, or other characteristics, have an unfavorable tilt, can use a function generator in accordance with the present invention to compensate the crystal which might be available at a very low cost due to its unfavorable tilt.

As described above, a cubic-type function generator constructed in accordance with the present invention provides complete control over all of the parameters of the output function. The amplitude of the output function is adjusted by the absolute magnitude of bias currents 11, 12, and 13, while the tilt is adjusted by varying the relative magnitudes of the bias currents. The zero crosses can be adjusted by adjusting the slope and crossover point of the voltage signals $V_{PTT}$ and $V_{BGP}$. The vertical offset of the output function can be adjusted by adjusting current source CS5 or by unbalancing the bias currents 11, 12 and 13. Finally, the shape of the output function can be compensated for variations in temperature by a compensation circuit. These adjustable parameters make a function generator in accordance with the present invention very useful for compensating crystal oscillators because they can be readily adapted to the particular characteristics of a specific crystal.

Figure 5:
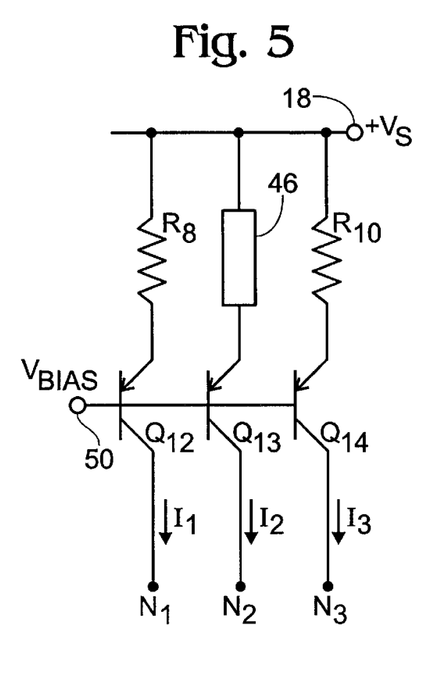
FIG. 5 is a schematic diagram of an embodiment of the current sources of FIG. 1 in accordance with the present invention.

FIG. 5 is a detailed schematic diagram showing more details of the current sources CS1, CS2, and CS3 of FIG. 1 which are implemented as PNP transistors Q12, Q13 and Q14, respectively. The emitter of Q12 is coupled to the positive power supply terminal through a resistor R8, while the emitter of Q14 is coupled to the positive power supply through a resistor R10. The collectors of transistors Q12, Q13 and Q14 are connected to nodes N1, N2 and N3, respectively. The bases of Q12, Q13 and Q14 are connected to a bias terminal 50 for receiving a bias voltage $V_{BIAS}$. The enitter of Q13 is coupled to the positive power supply terminal 18 through a tilt resistor network 46. Network 46 can be implemented at a simple resistor, or alternatively as a network of resistors which can be easily adjusted through laser cutting on an integrated circuit to adjust the tilt of the output function for a specific crystal.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A function generator comprising:
   a first differential pair of transistors arranged to generate a first current responsive to an input signal;
   a second differential pair of transistors arranged to generate a second current responsive to the input signal;
   a third differential pair of transistors arranged to generate a third current responsive to the input signal;
   a bias circuit coupled to the first, second, and third differential pairs for providing first, second, and third bias currents to the first, second, and third differential pairs, respectively; and a compensation circuit coupled to the first, second, and third differential pairs for providing the input signal;

wherein the first, second, and third differential pairs of transistors have different input offset voltages;

wherein the first, second, and third differential pairs are coupled together such that the first, second and third currents combine out of phase, thereby producing an output current having a combined output function that varies in a cubic-type manner responsive to variations in the input signal; and wherein the compensation circuit is constructed to adjust the input signal to compensate for temperature variations in the first, second, and third differential pairs.

2. A function generator according to claim 1 wherein the bias circuit adjusts the absolute magnitude of the bias currents, thereby changing the amplitude of the combined output function of the differential pairs.

3. A function generator according to claim 1 wherein the bias circuit adjusts the relative magnitude of one of the bias currents with respect to the other two bias currents, thereby changing the shape of the combined output function of the differential pairs.

4. A function generator according to claim 1 wherein said compensation circuit includes a voltage generator coupled to the first, second, and third differential pairs for generating the input signal responsive to a parameter.

5. A function generator according to claim 4 wherein the parameter is temperature.

6. A function generator according to claim 4 wherein:
the combined output function has an input axis;
the input signal has a slope; and
the compensation circuit adjusts the slope of the input signal, thereby expanding or compressing the combined output function of the differential pairs along the input axis.

7. A function generator according to claim 4 wherein:
the input signal is a differential voltage signal defined as the difference between a first single-ended voltage signal having a first slope and a second single-ended voltage signal having a second slope; and
the slope of the input signal is a differential slope defined as the difference between the first and second slope.

8. A function generator according to claim 1 wherein the output current is a differential current and further including a current mirror coupled to the first, second, and third differential pairs for generating a difference current responsive to the output current.

9. A function generator according to claim 1 wherein:
the bias circuit includes first, second, and third current sources;
the first differential pair includes a first transistor having an emitter coupled to the first current source, a base coupled to a first input terminal, and a collector coupled to a first node, and a second transistor having an emitter coupled to the first current source, a base coupled to a second input terminal, and a collector coupled to a second node;
the second differential pair includes a third transistor having an emitter coupled to the second current source, a base coupled to the first input terminal, and a collector coupled to the second node, and a fourth transistor having an emitter coupled to the second current source, a base coupled to the second input terminal, and a collector coupled to the first node; and
the third differential pair includes a fifth transistor having an emitter coupled to the third current source, a base coupled to the first input terminal, and a collector coupled to the first node, and a sixth transistor having an emitter coupled to the third current source, a base coupled to the second input terminal, and a collector coupled to the second node.

10. A function generator according to claim 9 wherein:
the first current source includes a seventh transistor having a first terminal coupled to receive a bias voltage, a second terminal coupled to the first differential pair, and a third terminal coupled to a power supply terminal;
the second current source includes an eighth transistor having a first terminal coupled to receive the bias voltage, a second terminal coupled to the second differential pair, and a third terminal coupled to the power supply terminal; and
the third current source includes a ninth transistor having a first terminal coupled to receive the bias voltage, a second terminal coupled to the third differential pair, and a third terminal coupled to the power supply terminal.

11. A function generator according to claim 10 wherein the bias circuit further includes:
a first resistor coupled between the third terminal of the seventh transistor and the power supply terminal;
a second resistor coupled between the third terminal of the eighth transistor and the power supply terminal; and
a third resistor coupled between the third terminal of the ninth transistor and the power supply terminal.

12. A function generator according to claim 9 further including:
a seventh transistor having a first terminal coupled to the first node, a second terminal coupled to a power supply terminal, and a third terminal coupled back to its first terminal; and
an eighth transistor having a first terminal coupled to the second node, a second terminal coupled to the power supply terminal, and a third terminal coupled to the third terminal of the seventh transistor;
wherein the seventh and eighth transistors form a current mirror.

13. A function generator according to claim 1 wherein the first and third differential pairs have different emitter area ratios than the second differential pair.

14. A function generator according to claim 1 wherein the compensation circuit varies the input signal in proportion to absolute temperature for a given value of a second input signal.

15. A function generator according to claim 14 wherein the compensation circuit includes a translinear multiplier having an input port for receiving the second input signal and an output port for coupling the input signal to the first, second and third differential pairs.

16. A function generator according to claim 15 wherein the translinear multiplier includes:
first and second transistors arranged to form a fourth differential pair for receiving the second input signal;
a current source coupled to the fourth differential pair for biasing the fourth differential pair; and
first and second diodes coupled to the first and second transistors at first and second node, respectively, wherein the first and second nodes provide the input signal to the first, second and third differential pairs.

17. A function generator according to claim 14 further including a thermometer circuit coupled to the compensation circuit to generate the second input signal.

18. A function generator according to claim 17 wherein:

the thermometer circuit is constructed to generate a bandgap signal which is stable with temperature and a temperature-dependent signal which varies in proportion to absolute temperature and crosses the bandgap signal at a cross-over point; and the second input signal is the difference between the bandgap signal and the temperature-dependent signal.

19. A function generator according to claim 18 wherein the bandgap signal and the temperature-dependent signal are derived from the same bandgap reference cell.

20. A function generator comprising:

a first differential pair of transistors arranged to generate a first current responsive to an input signal;

a second differential pair of transistors arranged to generate a second current responsive to the input signal;

a third differential pair of transistors arranged to generate a third current responsive to the input signal, wherein the first, second, and third differential pairs of transistors have different input offset voltages, and wherein the first, second, and third differential pairs are coupled together such that the first, second and third currents combine out of phase, thereby producing a differential output current that varies in a cubic-type manner responsive to variations in the input signal;

a bias circuit coupled to the first, second, and third differential pairs for providing first, second, and third bias currents to the first, second, and third differential pairs, respectively;

a current mirror coupled to the first, second, and third differential pairs for generating a difference current responsive to the differential output current; and a current-to-voltage converter coupled to the current mirror for generating an output voltage responsive to the difference current.

21. A function generator according to claim 20 further including means coupled to the current-to-voltage converter for adjusting the center voltage of the output voltage generated by the current-to-voltage converter.

22. A function generator according to claim 20 wherein the bias currents are unbalanced under normal conditions so as to adjust the center voltage of the output voltage generated by the current-to-voltage converter.

23. A function generator according to claim 20 wherein the current-to-voltage converter includes:

a transistor having a first terminal coupled to the current mirror;

a current source coupled to a second terminal of the transistor for providing a fourth bias current to the transistor; and a resistor coupled between the first and second terminals of the transistor.

24. A function generator according to claim 21 wherein:

the current-to-voltage converter includes:

a transistor having a first terminal coupled to the current mirror, a first current source coupled to a second terminal of the transistor for providing a fourth bias current to the transistor, and a resistor coupled between the first and second terminals of the transistor; and the means for adjusting the center voltage includes a second current source coupled to the first terminal of the transistor.

25. A function generator according to claim 24 wherein the second current source is a PTAT current source.

26. A function generator comprising:

a first differential pair of transistors arranged to generate a first current responsive to an input signal;

a second differential pair of transistors arranged to generate a second current responsive to the input signal;

a third differential pair of transistors arranged to generate a third current responsive to the input signal; and a bias circuit coupled to the first, second, and third differential pairs for providing first, second, and third bias currents to the first, second, and third differential pairs, respectively;

wherein the first, second, and third differential pairs of transistors have different input offset voltages;

wherein the first, second, and third differential pairs are coupled together such that the first, second and third currents combine out of phase, thereby producing an output current that varies in a cubic-type manner responsive to variations in the input signal;

wherein the bias circuit includes:

a first transistor having a first terminal coupled to receive a bias voltage, a second terminal coupled to the first differential pair to provide the first bias current thereto, and a third terminal coupled to a power supply terminal through a first resistor, a second transistor having a first terminal coupled to receive the bias voltage, a second terminal coupled to the second differential pair to provide the second bias current thereto, and a third terminal coupled to the power supply terminal through a second resistor, and a third transistor having a first terminal coupled to receive the bias voltage, a second terminal coupled to the third differential pair to provide the third bias current thereto, and a third terminal coupled to the power supply terminal through a third resistor; and wherein the second resistor is a resistor network for adjusting the relative magnitude of one of the bias currents with respect to the other two bias currents, thereby changing an angle at which the output current of the function generator passes through an inner zero cross.

27. A function generator comprising:

a first differential pair of transistors arranged to generate a first current responsive to an input signal;

a second differential pair of transistors arranged to generate a second current responsive to the input signal;

a third differential pair of transistors arranged to generate a third current responsive to the input signal; and a bias circuit coupled to the first, second, and third differential pairs for providing first, second, and third bias currents to the first, second, and third differential pairs, respectively;

wherein the first, second, and third differential pairs of transistors have different input offset voltages;

wherein the first, second, and third differential pairs are coupled together such that the first, second and third currents combine out of phase, thereby producing an output current that varies in a cubic-type manner responsive to variations in the input signal; and wherein:

the bias circuit includes first, second, and third current sources, the first differential pair includes a first transistor having an emitter coupled to the first current source, a base coupled to a first input terminal, and a collector coupled to a first node, and a second transistor having an emitter coupled to the first current source, a base coupled to a second input terminal, and a collector coupled to a second node, the second differential pair includes a third transistor having an emitter coupled to the second current source, a base coupled to the first input teminal, and a collector coupled to the second node, and a fourth transistor having an emitter coupled to the second current source, a base coupled to the second input terminal, and a collector coupled to the first node, and the third differential pair includes a fifth transistor having an emitter coupled to the third current source, a base coupled to the first input terminal, and a collector coupled to the first node, and a sixth transistor having an emitter coupled to the third current source, a base coupled to the second input terminal, and a collector coupled to the second node;

and further including:

a seventh transistor having a first terminal coupled to the first node, a second terminal coupled to a power supply terminal, and a third terminal coupled back to its first terminal; and an eighth transistor having a first terminal coupled to the second node, a second terminal coupled to the power supply terminal, and a third terminal coupled to the third terminal of the seventh transistor, wherein the seventh and eighth transistors form a current mirror;

a fourth current source;

a ninth transistor having a first terminal coupled to the fourth current source, a second terminal coupled to the power supply terminal, and a third terminal coupled to the second node; and a resistor coupled between the first and third terminals of the ninth transistor;

wherein the ninth transistor and the resistor form a current-to-voltage converter.

28. A function generator according to claim 27 further including a fifth current source coupled to the third terminal of the ninth transistor for shifting the center voltage of an output voltage signal generated by the current-to-voltage converter.

29. A function generator comprising:

a first differential pair of transistors arranged to generate a first current responsive to an input signal;

a second differential pair of transistors arranged to generate a second current responsive to the input signal;

a third differential pair of transistors arranged to generate a third current responsive to the input signal; and a bias circuit coupled to the first, second, and third differential pairs for providing first, second, and third bias currents to the first, second, and third differential pairs, respectively;

wherein the first, second, and third differential pairs of transistors have different input offset voltages;

wherein the first, second, and third differential pairs are coupled together such that the first, second and third currents combine out of phase, thereby producing an output current that varies in a cubic-type manner responsive to variations in the input signal; and wherein:

the bias circuit includes first, second, and third current sources, the first differential pair includes a first transistor having an emitter coupled to the first current source, a base coupled to a first input terminal, and a collector coupled to a first node, and a second transistor having an emitter coupled to the first current source, a base coupled to a second input terminal, and a collector coupled to a second node, the second differential pair includes a third transistor having an emitter coupled to the second current source, a base coupled to the first input terminal, and a collector coupled to the second node, and a fourth transistor having an emitter coupled to the second current source, a base coupled to the second input terminal, and a collector coupled to the first node, and the third differential pair includes a fifth transistor having an emitter coupled to the third current source, a base coupled to the first input terminal, and a collector coupled to the first node, and a sixth transistor having an emitter coupled to the third current source, a base coupled to the second input terminal, and a collector coupled to the second node;

and further including:

a second bias circuit;

a seventh transistor having a first terminal coupled to the first input terminal, a second terminal coupled to the second bias circuit, and a third terminal for receiving a first single-ended voltage signal;

an eighth transistor having a first terminal coupled to the second input terminal, a second terminal coupled to the second bias circuit, and a third terminal for receiving a second single-ended voltage signal;

a first diode coupled between the first input terminal and a power supply terminal; and a second diode coupled between the second input terminal and the power supply terminal.

30. A method for generating a cubic-type function comprising:

driving a first differential pair of transistors having a first input offset voltage responsive to an input signal, thereby generating a first tanh signal;

driving a second differential pair of transistors having a second input offset voltage responsive to the input signal, thereby generating a second tanh signal;

driving a third differential pair of transistors having a third input offset voltage responsive to the input signal, thereby generating a third tanh signal;

combining the first, second and third tanh signals out of phase, thereby generating an output signal having a cubic-type output function; and compensating the input signal so as to compensate for temperature variations in the first, second, and third differential pairs.

31. A method according to claim 30 further including adjusting the slope of the input signal.

32. A method according to claim 11 wherein the input signal is a differential signal, and further including adjusting the slope and crossover point of the input signal, thereby adjusting the zero crosses of the output signal.

33. A method according to claim 30 further including biasing the first, second and third differential pairs with first, second and third bias currents, respectively.

34. A method according to claim 33 further including adjusting the absolute magnitudes of the bias currents, thereby adjusting the magnitude of the output signal.

35. A method according to claim 33 further including adjusting the relative magnitudes of one of the bias currents with respect to the other two bias currents, thereby adjusting the tilt of the output function.

36. A method according to claim 33 further including adjusting the balance of the bias currents, thereby shifting the level of the output signal.

37. A method according to claim 30 wherein compensating the input signal includes converting the input signal to a PTAT signal.

* * * * *

UNITED STATES PATENT AND TRADEMARK OFFICE
CERTIFICATE OF CORRECTION

PATENT NO. : 6,002,291
DATED : December 14, 1999
INVENTOR(S) : Gilbert

It is certified that error appears in the above-identified patent and that said Letters Patent is hereby corrected as shown below:

Column 1,
Line 55, "is provide a technique" should read -- is to provide a technique --;

Column 3,
Line 39, "VI" should read -- V1 --;

Columns 4, 5, 7, 8,
Several lines, "11, 12, 13" should read -- I1, I2, I3 --;

Column 4,
Lines 9, 13, 51-52, 56, "$V_t$ In" should read -- $V_t$ ln --;

Column 5,
Line 18, "VC" should read -- Vc --;
Lines 32 and 36, "K." should read -- K --;
Line 48, "VIN" should read -- $V_{IN}$ --;
Line 61, "VBPG" should read -- $V_{BGP}$ --;
Line 62, "Q1" should read -- Q11 --;

Column 6,
Line 4, "In" should read -- ln --;

Column 7,
Lines 55-56, "C." should read -- C --;

UNITED STATES PATENT AND TRADEMARK OFFICE
CERTIFICATE OF CORRECTION

PATENT NO. : 6,002,291
DATED : December 14, 1999
INVENTOR(S) : Gilbert

It is certified that error appears in the above-identified patent and that said Letters Patent is hereby corrected as shown below:

Column 8,
Line 46, "enitter" should read -- emitter --.

Signed and Sealed this

Second Day of April, 2002

Attest:

JAMES E. ROGAN
Attesting Officer    Director of the United States Patent and Trademark Office